(12) United States Patent
Suzuki et al.

(10) Patent No.: US 6,417,885 B1
(45) Date of Patent: *Jul. 9, 2002

(54) SOLID-STATE IMAGE PICKUP DEVICE WITH A SEPARABLE CIRCUIT BOARD

(75) Inventors: Takahisa Suzuki, Kanagawa; Takayuki Yoshida, Osaka, both of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/697,679

(22) Filed: Aug. 28, 1996

(30) Foreign Application Priority Data

Aug. 30, 1995 (JP) .............................. 7-222329

(51) Int. Cl.$^7$ .............................. H04N 5/225
(52) U.S. Cl. .............................. 348/374
(58) Field of Search .............................. 348/374, 294, 348/87, 86, 76, 75, 72, 65, 61, 45, 373, 375

(56) References Cited

U.S. PATENT DOCUMENTS

| | | | | |
|---|---|---|---|---|
| 3,971,127 A | * | 7/1976 | Giguere et al. | 439/77 |
| 4,374,605 A | * | 2/1983 | Bratt | 339/143 R |
| 4,495,546 A | * | 1/1985 | Nakamura et al. | 361/398 |
| 4,509,095 A | * | 4/1985 | Boros | 439/77 |
| 4,567,543 A | * | 1/1986 | Miniet | 361/398 |
| 4,745,471 A | * | 5/1988 | Takamura et al. | 348/76 |
| 4,781,601 A | * | 11/1988 | Kuhl et al. | 439/77 |
| 4,831,456 A | * | 5/1989 | Takamura | 348/374 |
| 4,855,838 A | * | 8/1989 | Jones et al. | 348/373 |
| 4,918,521 A | * | 4/1990 | Yabe et al. | 348/373 |
| 4,997,377 A | * | 3/1991 | Goto et al. | 439/68 |
| 5,021,888 A | * | 6/1991 | Kondou et al. | 348/76 |
| 5,218,462 A | * | 6/1993 | Kitamura et al. | 348/294 |
| 5,224,023 A | * | 6/1993 | Smith et al. | 439/67 |
| 5,233,426 A | * | 8/1993 | Suzuki et al. | 348/373 |
| 5,335,553 A | * | 8/1994 | Ueki et al. | 439/76 |
| 5,365,268 A | * | 11/1994 | Minami | 348/76 |
| 5,434,362 A | * | 7/1995 | Klosowiak et al. | 439/77 |
| 5,448,511 A | * | 9/1995 | Paurus et al. | 439/77 |
| 5,754,313 A | * | 5/1998 | Pelchy et al. | 348/76 |

FOREIGN PATENT DOCUMENTS

| | | |
|---|---|---|
| JP | Sho 60-208726 | 10/1985 |
| JP | Hei 3-71688 | 11/1991 |

* cited by examiner

Primary Examiner—Wendy R. Garber
Assistant Examiner—Aung S. Moe
(74) Attorney, Agent, or Firm—Pearne & Gordon LLP

(57) ABSTRACT

An image pickup section incorporates a solid-state image pickup element chip. Electronic parts for driving or controlling the image pickup section are mounted on a circuit board. First and second electrode pad groups are formed on the circuit board, and a separation band is also formed on the circuit board between the first and second electrode pad groups. The circuit board is used as it is when the image pickup device is not required to be bendable. When the image pickup device is required to be bendable, the circuit board is separated by cutting it at the separation band and the first and second electrode pad groups that are now respectively located on the separated pieces of the circuit board are connected to each other by signal lines.

10 Claims, 7 Drawing Sheets

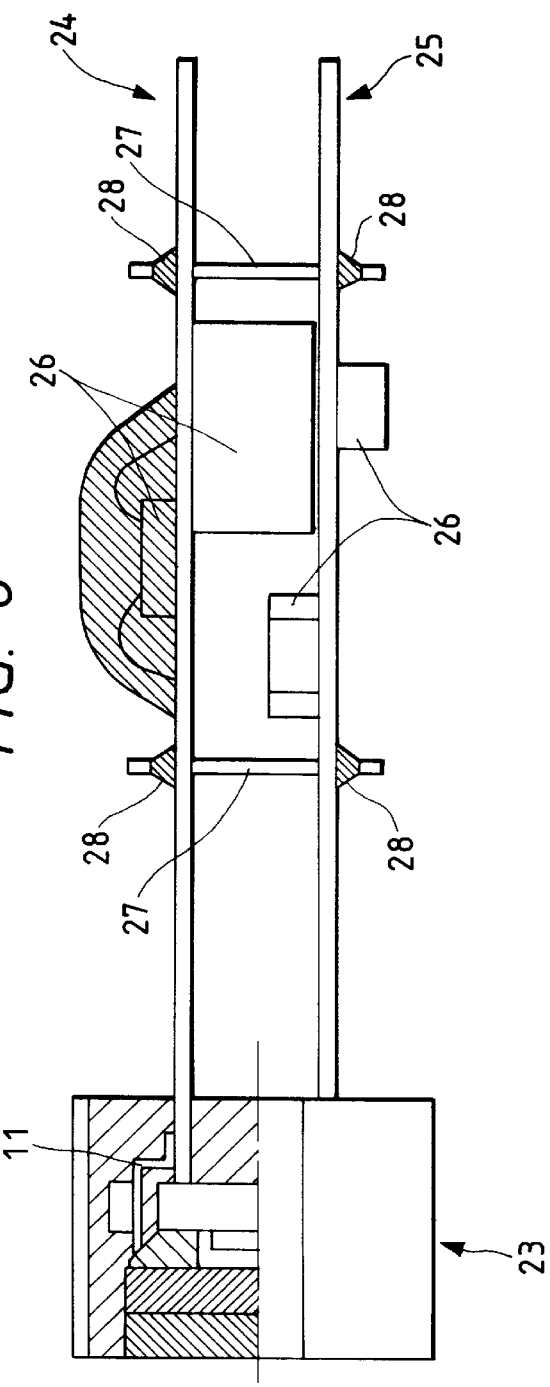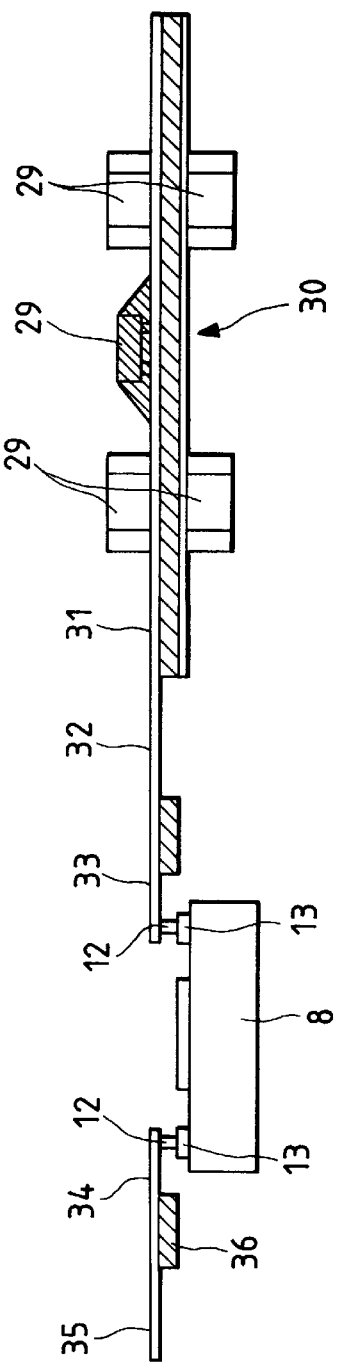

SOLID-STATE IMAGE PICKUP DEVICE WITH A SEPARABLE CIRCUIT BOARD

BACKGROUND OF THE INVENTION

1. Field of the Invention

The present invention relates to a solid-state image pickup device which renders the tip inserting portion of an electronic endoscope bendable in an arbitrary direction and which can be used commonly in various types of electronic endoscopes.

2. Description of the Related Art

In general, endoscopes used for medical and industrial purposes incorporate a solid-state image pickup device at the tip of an inserting portion. The inserting portion assumes a variety of shapes depending on the use of an endoscope. For example, the length and the diameter of the inserting portion subdivide in ranges of 0.5–30 m and 4–12 mm, respectively. The inserting portion is further classified into types having view-range-related functions such as a direct view function and an oblique view function, a type in which the tip of the inserting portion is bendable, and other types. Therefore, the configurations of solid-state image pickup devices incorporated in such endoscopes need to be designed for the respective types of inserting portions.

Japanese Examined Patent Publication No. Hei. 3-71688 and Japanese Unexamined Patent Publication No. Sho. 60-208726 disclose typical solid-state image pickup devices used at the tip of an inserting portion of conventional electronic endoscopes, which devices will be described below in detail.

FIG. 11 schematically shows an example of a conventional solid-state image pickup device. In FIG. 11, reference numeral 100 denotes a solid-state image pickup element chip; 101, a receptacle; 102, a metal thin wire; 103, an optical glass plate; 104, a lead terminal; 105, solder; 106, a circuit board; 107, an electronic part; and 108, a signal line.

In this solid-state image pickup device, the circuit board 106 is provided adjacent to the back surface of the receptacle 101 so as to extend approximately perpendicularly to the latter. The top and bottom lead terminals 104 extending from the receptacle 101 are bent inward and bonded, with the solder 105, to electrode pads (not shown) of the circuit board 106 on which the electronic parts 107 are mounted. The signal lines 108 are bonded, with the solder 105, to electrode pads (not shown) that are provided on a rear end portion of the circuit board 106. The solid-state image pickup element chip 100 is die-bonded to the receptacle 101, and the metal thin wires 102 are wire-bonded to electrode pads (not shown) that are formed on the respective surfaces of the solid-state image pickup element chip 100 and the receptacle 101. The electrode pads of the receptacle 101 are connected to the lead terminals 104 via an internal wiring pattern (not shown) formed on an inside layer of the receptacle 101. The receptacle 101 is hermetically sealed with the optical glass plate 103.

The structure of the above solid-state image pickup device is suitable for use in an inserting portion of an endoscope which is small in diameter and is not required to be bendable. This is because where the circuit board 106 needs to accommodate a large-scale circuit, the electronic parts mounting area can be increased by increasing the length of the circuit board 106 rather than its width. However, the above structure is not suitable for use in an inserting portion that is required to have a shallow tip as well as to be bendable.

FIG. 12 shows another example of a conventional solid-state image pickup device. In this device, in contrast to the case of FIG. 11, a circuit board 109 mounted with electronic parts 110 is provided adjacent to the back surface of a receptacle 101 in parallel therewith. The circuit board 109 has through-holes (not shown) at positions opposed to lead terminals 104. The lead terminals 104 are inserted through the through-holes (not shown) and bonded thereto with solder 105. To make the inserting portion small in diameter, the outer size of the circuit board 106 is set the same as or smaller than that of the receptacle 101. Since the structure in the neighborhood of the solid-state image pickup element chip 100 is the same as that shown in FIG. 11, it is not described here.

The solid-state image pickup device of FIG. 12 is suitable for use in an inserting portion which is required to be bendable, because it allows the tip of the inserting portion to be made short. However, in contrast to the case of FIG. 11, the degree of freedom of circuit designing is low, because the outer size of the circuit board 109 is limited by that of the tip of the inserting portion of an endoscope.

As described above, in the conventional solid-state image pickup devices, the configuration is designed individually in accordance with the functions/properties or the size required for each endoscope. Therefore, they cannot be used commonly in a variety of endoscope inserting portions, and developing a solid-state image pickup device each time for each particular use takes long time.

SUMMARY OF THE INVENTION

The present invention has been made to solve the above-described problems in the art, and has an object of providing a solid-state image pickup device which makes the tip of an inserting portion small and does not lower the bendability of the inserting portion, and which can be used commonly in a variety of endoscopes.

To attain the above object, according to the invention, there is provided a solid-state image pickup device in which first and second electrode pad groups that are electrically connected to each other are formed on a circuit board, which extends approximately perpendicularly to the back surface of a solid-state image pickup element chip, with a gap that allows the circuit board to be separated in the width direction by cutting.

With the above configuration, the invention provides an advantage that the solid-state image pickup device can accommodate at least two types of endoscopes. That is, the circuit board is used as it is, i.e., without cutting it for use in an endoscope that is not required to be bendable. For use in an endoscope that is required to be bendable, the circuit board of a completed solid-state image pickup device is cut and the separated pieces of the circuit board are connected to each other by a separately provided connection member and thereby kept away from each other when used.

Further, the separation and elongation of the circuit board can be conducted either in a manufacturer of a solid-state image pickup device or in a manufacturer of an endoscope. Thus, the manufacturer of an endoscope can determine, on its own, the length of an elongated circuit board and the structure for incorporating an image pickup device in the inserting portion of an endoscope.

BRIEF DESCRIPTION OF THE DRAWINGS

FIG. 6 is a front view of a solid-state image pickup device according to a second embodiment of the invention;

FIG. 7 is an appearance showing how a solid-state image pickup element chip is connected to a circuit board in a third embodiment of the invention;

DESCRIPTION OF THE PREFERRED EMBODIMENTS

Embodiments of the present invention will be hereinafter described with reference to the accompanying drawings.

Embodiment 1

Figure 1A:
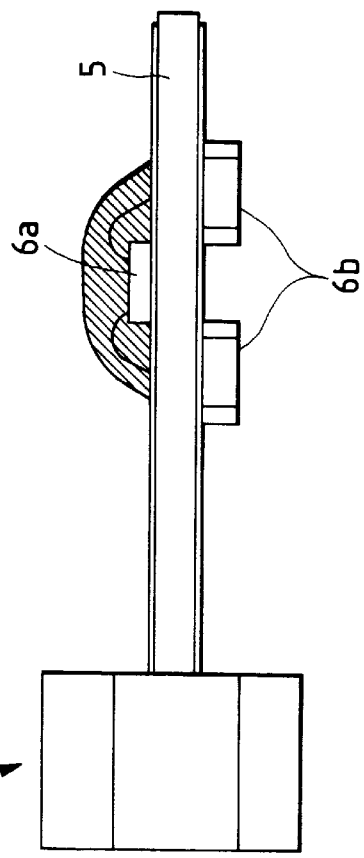
FIGS. 1A–1C are a front view, a left side view, and a plan view showing the configuration of a solid-state image pickup device according to a first embodiment of the present invention.
Figure 1B:
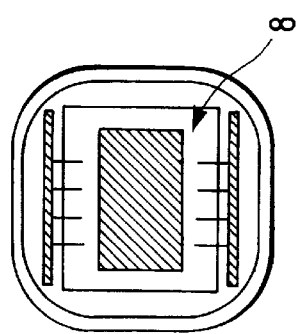
Figure 1C:
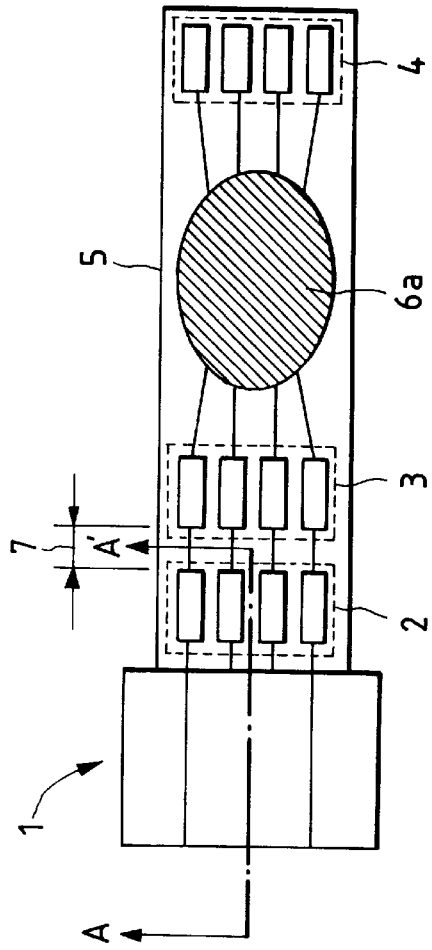

FIGS. 1A–1C are a front view, a left side view, and a plan view showing the configuration of a solid-state image pickup device according to a first embodiment of the invention. In FIGS. 1A–1C, reference numeral 1 denotes an image pickup section; 2, a first electrode pad group; 3, a second electrode pad group; 4, a third electrode pad group; 5, a circuit board; 6a and 6b, electronic parts; and 7, a separation band. The electrode pad groups 2–4 and the electronic parts 6a and 6b are connected to each other via a wiring pattern formed on the circuit board 5.

This embodiment is generally configured such that the circuit board 5 is coupled to the back side of the image pickup section 1 so as to extend approximately perpendicularly to its back surface. The electronic parts 6a and 6b for driving or controlling the image pickup section 1 are mounted on both surfaces of the circuit board 5. Further, the electrode pad groups 2 and 3 are provided between the image pickup section 1 and the electronic parts 6a and 6b on one or both surfaces of the substrate 5. Although the electrode pad groups 2 and 3 may have an arbitrary electrode pitch and size, it is desirable that at least the width and the position of the separation bands 7 be identical in the case where the electrode pad groups 2 and 3 are provided on both surfaces of the circuit board 5 (the reason will be described later in detail). Signal lines (not shown) for transmitting input and output signals of the solid-state image pickup device are connected to the electrode pad group 4 which is provided on a rear end portion of the circuit board 5.

Next, a description will be made of the separation width and the manner of separation of the circuit board 5. Since the width of the separation band 7 formed between the electrode pad groups 2 and 3 depends on the means for effecting the separation, it is necessary to assume the separating means in advance. For example, if the use of a cutting machine having a diamond blade is assumed, a cutting width of about 0.5 mm is sufficient. With a further assumption that the clearance between the end of each separated piece of the circuit board 5 and the electrode pad group 2 or 3 formed thereon is 0.5 mm, it is concluded that the width of the separation band 7 should be about 1.5 mm. Where the electrode pad groups 2 and 3 are provided on both surfaces of the circuit board 5, it is desirable that the width and the position of the separation bands 7 on both surfaces of the circuit board 5 be identical because it is not expected that the position of separation is determined with high accuracy when a target of the cutting part is recognized by a simple means, as in the case of visual recognition.

Figure 2:
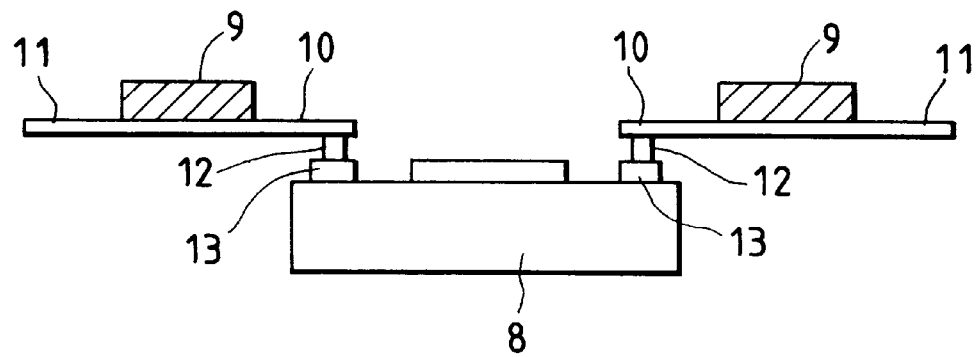
FIG. 2 is an appearance showing how a solid-state image pickup element chip is mounted according to a TAB scheme in the first embodiment of the invention.

Next, the internal structure of the image pickup section 1 will be described with reference to FIGS. 2–4. FIG. 2 is an appearance showing how a solid-state image pickup element chip is mounted according to a TAB (tape automated bonding) scheme. In FIG. 2, reference numeral 8 denotes a solid-state image pickup element chip; 9, a tie-bar film; 10, an inner lead; 11, an outer lead; 12, a bump; and 13, an electrode pad. The inner leads 10 are connected, via the bumps 12, to the respective electrode pads 13 which are provided along the right and left sides of the solid-state image pickup element chip 8. The connection between the inner leads 10 and the electrode pads 13 is performed by a proper connecting technique such as single point bonding in which connection is effected on a lead-by-lead basis.

Figure 3:
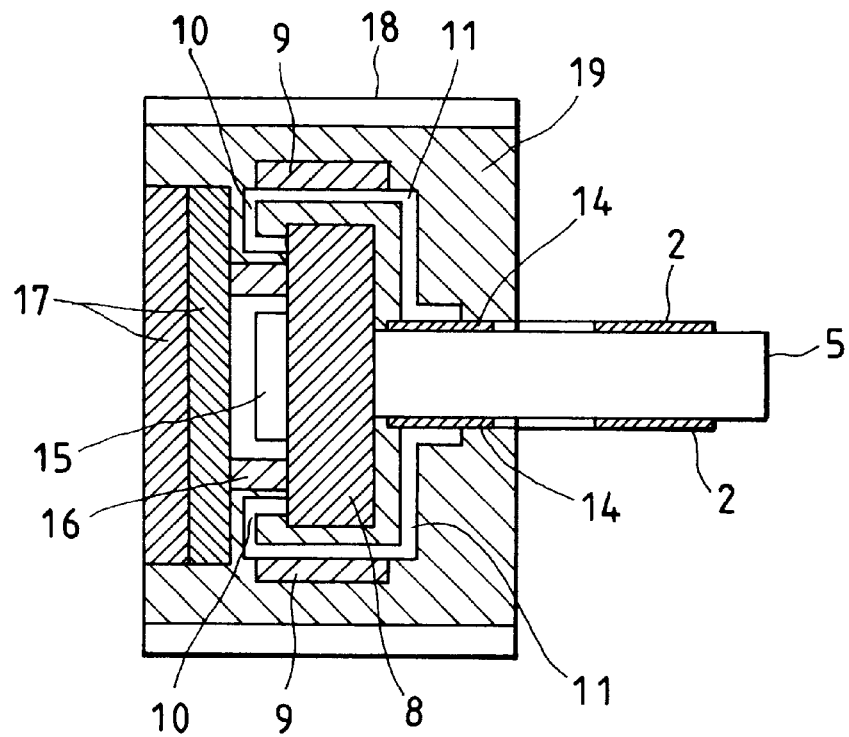
FIG. 3 is a sectional view of an image pickup section according to the first embodiment of the invention.

FIG. 3 is a sectional view showing the internal structure of the image pickup section 1. The circuit board 5 is so disposed as to contact with the back surface of the TAB-mounted solid-state image pickup element chip 8. The outer leads 11 extending from the tie-bar film 9 are soldered (not shown) to an internal electrode pad group 14 of the circuit board 5 by thermocompression bonding, for instance. Thus, the solid-state image pickup element chip 8 and the circuit board 5 are electrically connected to each other. On the photodetecting surface side of the solid-state image pickup element chip 8, a transparent plate 17 is fixed to the image pickup element chip 8 via, for instance, a thixotropic ultraviolet-curing resin 16 that is provided around a photodetecting portion 15 of the image pickup element chip 8. To secure the reliability of the solid-state image pickup element chip 8, the portion from the side face of the transparent plate 17 to the internal electrode pad group 14 that is formed on the surface of the circuit board 5 is hermetically sealed by enclosing that portion by a container made of a metal material such as stainless steel or covar, and filling the inside space with a sealing agent 19 and setting it. As a result of the sealing operation, the circuit board 5 is held by the sealing agent 19 and thereby given sufficient mechanical strength.

The above description is directed to the structure in which the electrode pads 13 of the solid-state image pickup element chip 8 are provided along the two opposed sides. It goes without saying that if the electrode pads 13 are formed along only one side, the TAB mounting portion is also provided for only one side. The container 18 may be omitted if the image pickup device is used in an environment in which it is hardly affected by the humidity. The transparent plate 17 may be either a single plate of an infrared-cutting filter, an optical glass plate, a quartz filter, or the like, or a composite plate of an infrared-cutting filter and a quartz filter, for instance. The circuit board 5 may be made of a glass epoxy board, a ceramic board, a FPC board, a TAB film, or the like, or some other inorganic or organic material that is rigid or bendable.

Figure 4:
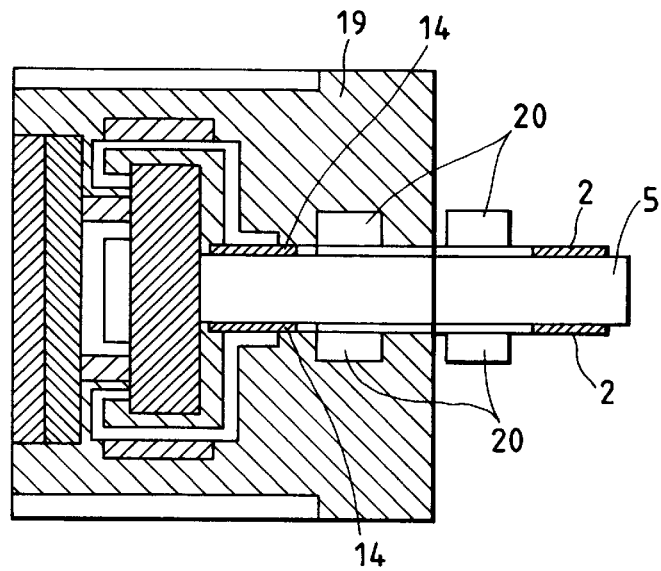
FIG. 4 is a sectional view showing another example of an image pickup section according to the first embodiment of the invention.

Further, as shown in FIG. 4, depending on the length of the separated and elongated portion, electronic parts for compensating for the elongation such as high-frequency-stopping chip capacitors 20 may be provided between the internal electrode pad groups 14 and the electrode pad groups 2 of the circuit board 5.

Figure 5A:
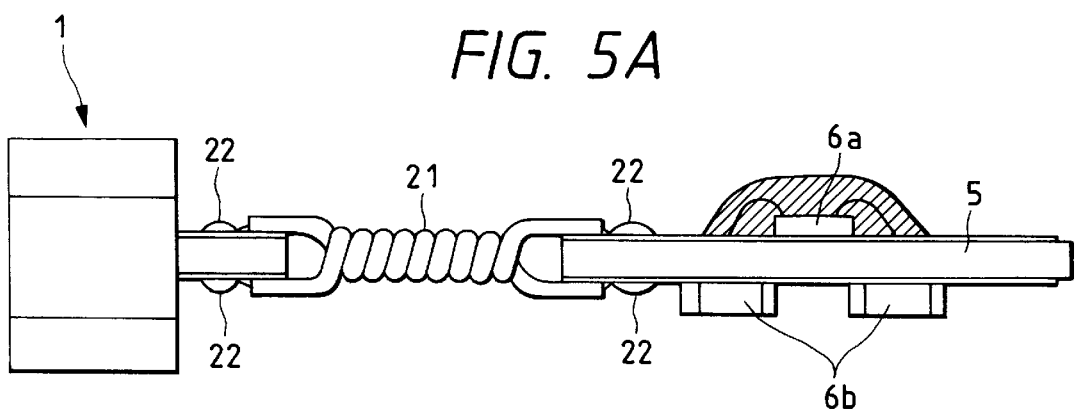
FIGS. 5A and 5B are a front view and a plan view of the solid-state image pickup device with a separated circuit board according to the first embodiment of the invention.
Figure 5B:
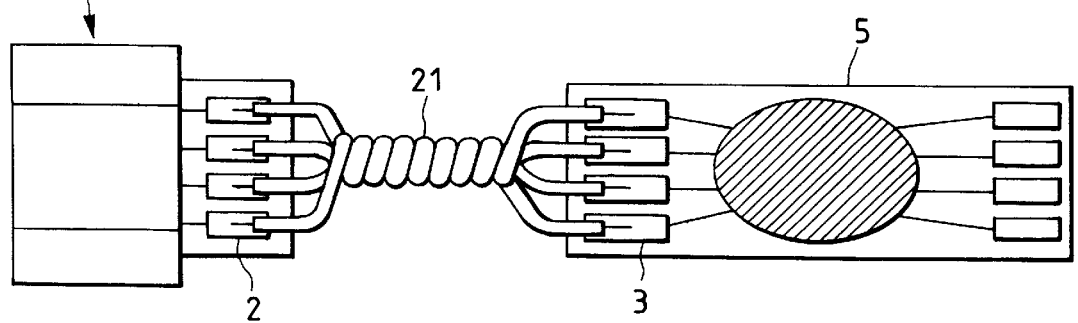

Next, a method of elongating the image pickup device after the cutting and separation of the circuit board 5 will be described with reference to FIGS. 5A and 5B, which are a front view and a plan view, respectively, of the solid-state image pickup device in which the circuit board 5 has been separated by cutting. The parts shown in FIGS. 5A and 5B and given the same reference numerals as the corresponding parts in FIGS. 1A–1C have the same configurations as the latter. After the circuit board 5 is separated by cutting it at the separation bands 7, the electrode pad groups 2 and 3 on the separated pieces of the circuit board 5 are connected to each other by signal lines 21 that consist of coaxial wires and insulated wires. The signal lines 21 are bonded to the respective pads of the electrode pad groups 2 and 3 with solder 22. Thus, the image pickup section 1 and the circuit board 5 are electrically connected to each other, to render the image pickup section 1 drivable. The length of the separated and elongated portion depends on the type of endoscope, and is about 50–150 mm. As described above, influences of high-frequency noise etc. that would be generated by the separation and elongation can be compensated for by the high-frequency-stopping chip capacitors 20, for instance. The signal lines 21 used above for the separation and elongation may be replaced by a flexible wiring board, lead terminals, or the like.

As described above, the first embodiment is provided with the separation band 7 at which the circuit board 5 can be cut in the width direction so as to be separated into two pieces, and the electrode pad groups 2 and 3 that allow re-connection. This provides advantages that the image pickup section 1 and the circuit board 5 can easily be separated from each other by cutting after assembling of the solid-state image pickup device is completed, and that the distance between the image pickup section 1 and the circuit board 5 can be determined arbitrarily.

Embodiment 2

FIG. 6 is a front view of a solid-state image pickup device according to a second embodiment of the invention. FIG. 6 is drawn with a larger enlargement ratio than FIGS. 1A–1C. In FIG. 6, reference numeral 23 denotes an image pickup section; 24, an upper circuit board; 25, a lower circuit board; 26, an electronic part; 27, a lead terminal; and 28, solder. Each of the upper and lower circuit boards 24 and 25 has the same circuit board separating structure as the circuit board 5 of the first embodiment (see FIG. 1C). The internal structure of the image pickup section 23 is approximately the same as that of the image pickup section 1 of the first embodiment (see FIG. 3); differences are that the former structure includes the upper and lower circuit boards 24 and 25 and that the outer leads 11 in the former structure are somewhat shorter than those in the latter structure. Therefore, a detailed description of the internal structure of the image pickup section 23 is omitted.

The upper and lower circuit board 24 and 25 are coupled to the back side of the image pickup section 23 and extend parallel with each other. The electronic parts 26 are mounted on both surfaces of each circuit board 24 or 25. The lead terminals 27 are connected to the circuit boards 24 and 25 at least at two locations excluding the area of the circuit board separating structure (not shown) that is provided on the surface of each circuit board 24 or 25, such that the lead terminals 27 are inserted into through-holes (not shown) formed in the circuit boards 24 and 25 and bonded to the circuit boards 24 and 25 with the solder 28. The lead terminals 27 serve to fix the positions of the upper and lower circuit boards 24 and 25, and also serve as wiring conductors. Where an increased degree of mechanical strength is needed, an adhesive (not shown) may be injected into the space between the circuit boards 24 and 25 from their side and then set to thereby enhance the fixation.

As described above, the second embodiment provides the following advantages in addition to the advantages of the first embodiment. That is, by virtue of the two-story configuration in which the circuit boards 24 and 25 are disposed parallel with each other, the mounting density of electronic parts can be increased and the circuit boards can be made smaller.

Embodiment 3

Figure 8:
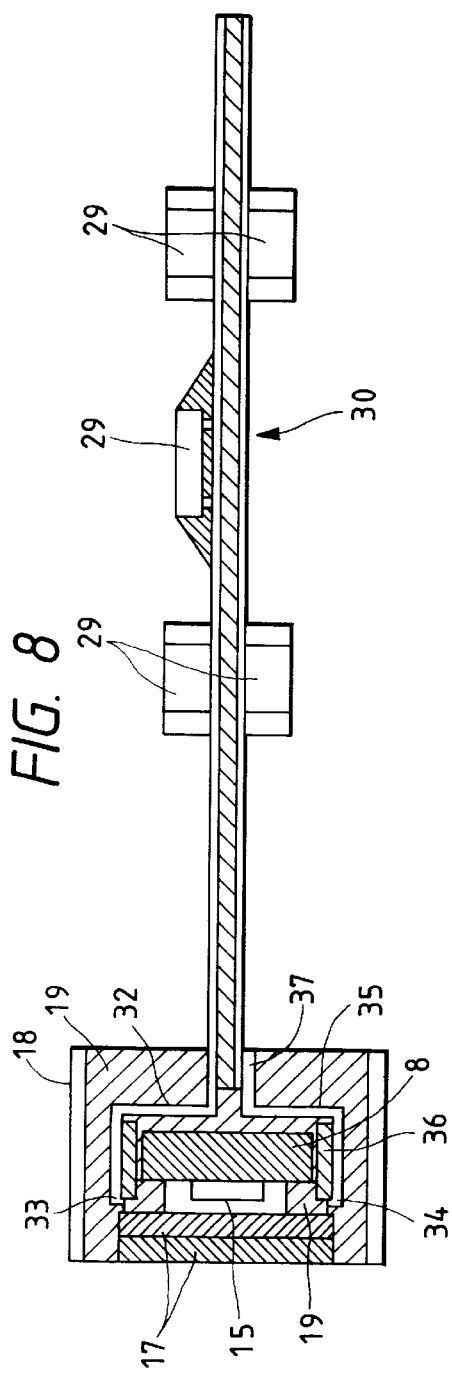
FIG. 8 is a sectional view of a solid-state image pickup device according to the third embodiment of the invention.

FIGS. 7 and 8 show a solid-state image pickup device according to a third embodiment of the invention. This image pickup device is much different from the image pickup devices of the first and second embodiments in that a circuit board itself extends to the front side of an image pickup section. FIG. 7 is an appearance showing how a solid-state image pickup element chip is connected to a circuit board, and FIG. 8 is a sectional view of a solid-state image pickup device. The parts shown in FIGS. 7 and 8 and given the same reference numerals as the corresponding parts in FIGS. 2 and 3 (first embodiment) have the same configurations as the latter, and therefore will not be described here.

As shown in FIG. 7, in a circuit board 30 mounted with electronic parts 29 and connected to a solid-state image pickup element chip 8, a circuit is formed by using a TAB film. The circuit board 30 is so configured that a circuit wiring pattern 31, outer leads 32, and inner leads 33 form an integral part. The inner leads 33 are connected to the solid-state image pickup element chip 8 in the same manner as in the first embodiment. On the left side of the solid-state image pickup element chip 8, there are provided only inner leads 34, outer leads 35, and a tie-bar film 36 (a TAB film has no circuit formed thereon).

As shown in FIG. 8, the circuit board 30 mounted with the electronic parts 29 is bent so as to be opposed to the side surface and the back surface of the solid-state image pickup element chip 8, and extended backward from a central portion of the back surface of the image pickup element chip 8. Further, the solid-state image pickup element chip 8 and the circuit board 30 are fixed to each other with a sealing agent 19. The circuit board 30 has a separation band 7 having the same structure as the separation band 7 of the circuit board 5 shown in FIG. 1C (first embodiment). The outer leads 35 are soldered (not shown) to electrode pads 37 that are formed on the surface of an end portion of the circuit board 30. Thus, the solid-state image pickup element chip 8 and the circuit board 30 are electrically connected to each other.

This embodiment is directed to the case where the electrode pads 13 of the solid-state image pickup element chip 8 are provided along the two opposed sides. If the electrode pads 13 are formed along only one side, the TAB mounting portion shown in the bottom part in FIG. 8 is unnecessary and therefore the electrode connection structures are simplified.

As described above, the third embodiment eliminates the connection between the TAB film outer leads and the circuit board on one or both sides. Therefore, the third embodiment provides an advantage that the reliability of the connection structures is improved.

The solid-state image pickup devices according to the embodiments of the invention were described above. A general description will now be made of how they are incorporated in the inserting portion of an endoscope.

Figure 9:
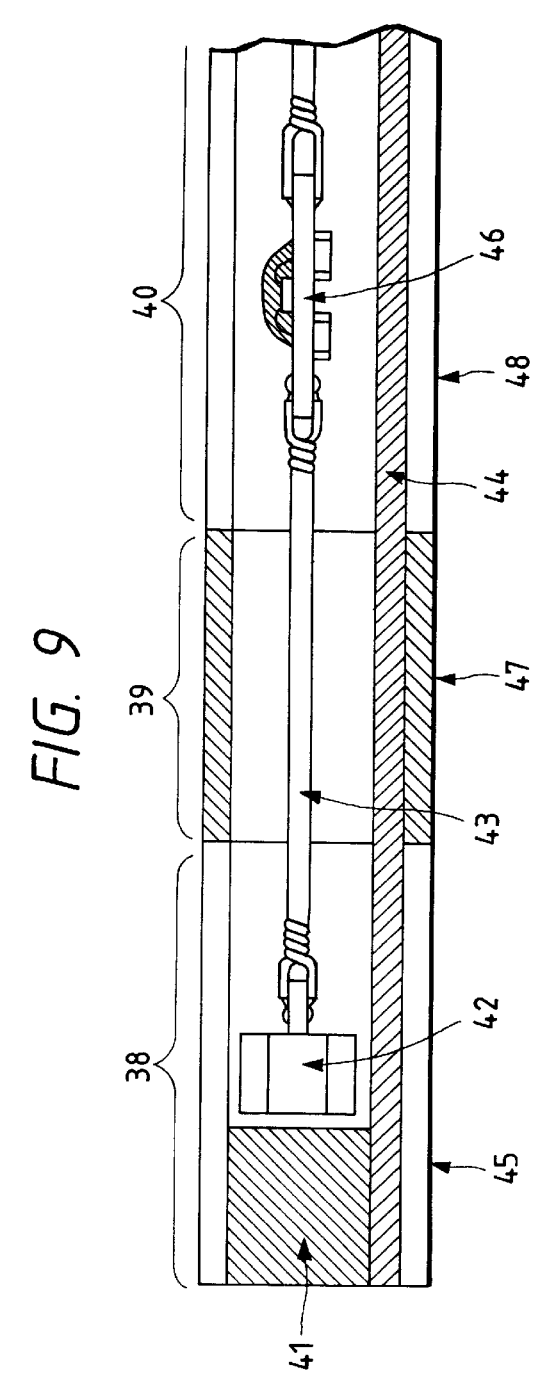
FIG. 9 is a partial sectional view showing a state that a solid-state image pickup device of the invention is incorporated in the inserting portion of an endoscope.

FIG. 9 shows an example in which a separated and elongated solid-state image pickup device is incorporated in the inserting portion of an endoscope. In FIG. 9, an optical lens 41, an image pickup section 42, signal lines 43, a circuit board 46, and a light guide 44 are provided in a tip portion 38, a bendable portion 39, and an extending portion 40. The tip portion 38 incorporates the optical lens 41, the image pickup section 42, and part of the light guide 44, and is enclosed by a metal pipe 45. The signal lines 43 for transmitting signals of the image pickup section 42 are connected to the image pickup section 42 and provided in the rear thereof, and the circuit board 46 is connected to the signal lines 43 and provided in the rear thereof. The signal lines 43 are surrounded by a flexible pipe 47, and the circuit board 46 is surrounded by a rigid metal pipe or a universal cord 48. Each of the tip portion 38 and the circuit board 46 is fixed by a special fixing mechanism (not shown).

Figure 10:
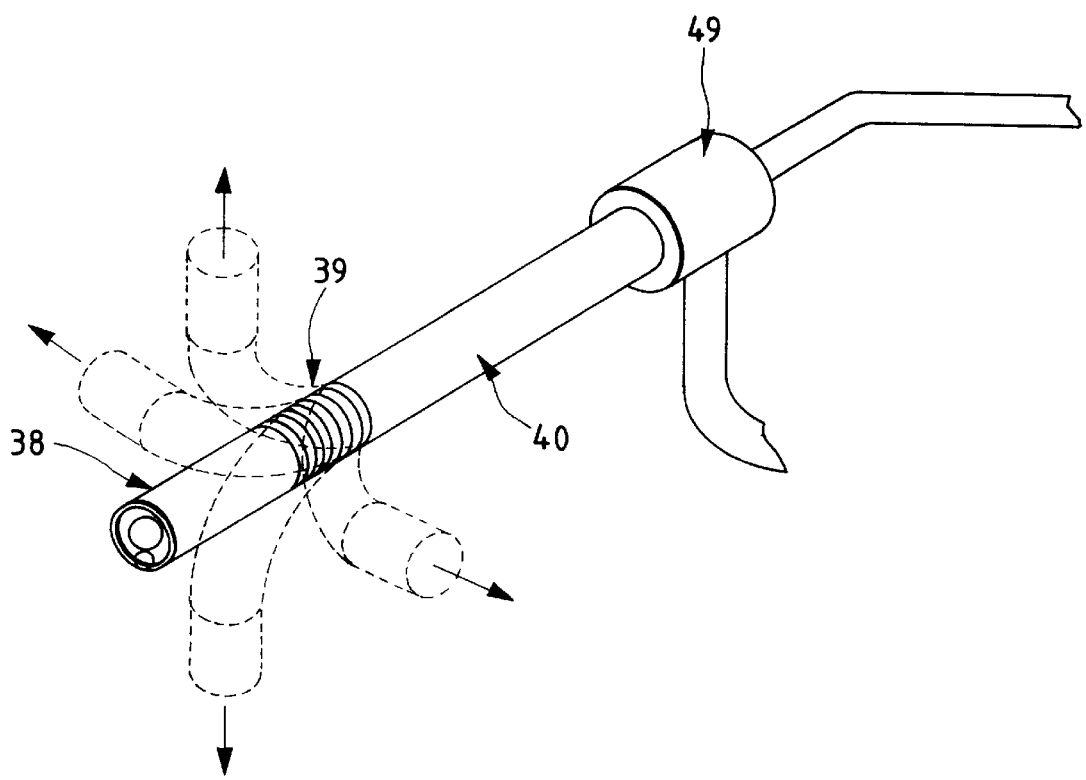
FIG. 10 is a partial perspective view illustrating action of an endoscope incorporating the image pickup device of FIG. 9.
Figure 11:
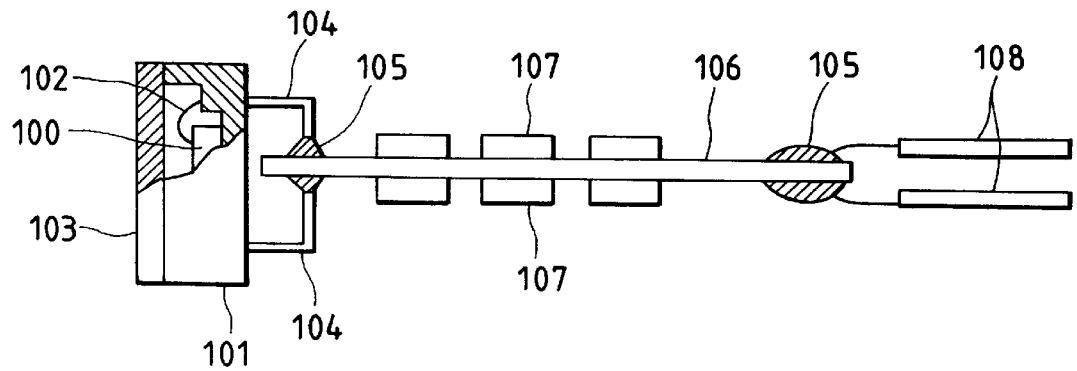
FIGS. 11 and 12 are front views showing examples of conventional solid-state image pickup devices.
Figure 12:
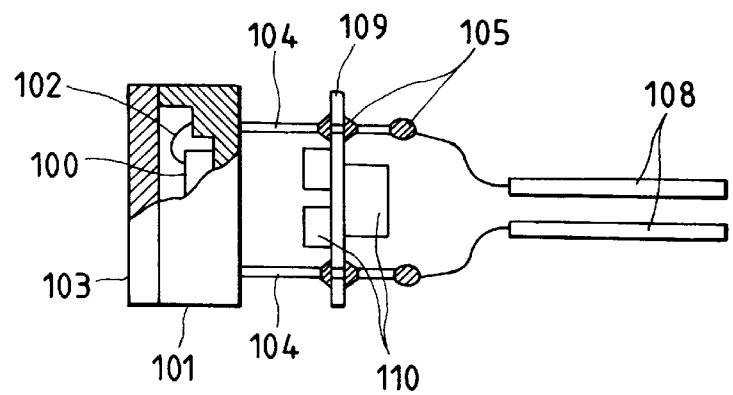

FIG. 10 shows an appearance of the tip inserting portion and its vicinity of the endoscope. The tip portion 38 incorporating the image pickup section 42 is bent by manipulating a bending switch (not shown) that is provided in an operating section 49.

With the above method of incorporating the image pickup device, the image pickup section that is provided at the tip of an endoscope can be reduced in diameter, which could not be attained satisfactorily in the art. Further, the image pickup section can be made smaller by disposing the circuit board in the extending portion having an ample space. Still further, the degree of freedom of circuit designing is improved with no limitations on the circuit scale.

In the invention, as was exemplified by the above embodiments, the first and second electrode pad groups that are electrically connected to each other are formed on the circuit board, which extends approximately perpendicularly to the back surface of the solid-state image pickup element chip, with the gap that allows the circuit board to be separated in the width direction by cutting. Therefore, the image pickup device of the invention can accommodate both of soft-type endoscopes that are required to be bendable and hard-type endoscopes that are not so required by selecting between the state in which the circuit board is used as it is and the state in which it is used in a separated state. That is, a single solid-state image pickup device can be used commonly in at least two different types of endoscopes.

Further, the image pickup section and the circuit board section can be separated from each other at a desired distance either in a manufacturer of a solid-state image pickup device or in a manufacturer of an endoscope. Thus, the solid-state image pickup device of the invention does not impose any limitations on the internal implementation designing of the inserting portion of an endoscope.

What is claimed is:

1. A solid-state image pickup device comprising:
a solid-state image pickup element chip; and
a unitary circuit board mounted with electronic parts and adapted to be severed into first and second circuit boards which may then be readily re-connected, said unitary circuit board being electrically connected to the image pickup element chip, and extending approximately perpendicularly to a back surface of the image pickup element chip, the unitary circuit board comprising:
first and second electrode pad groups provided adjacent to the image pickup element chip and connected to each other electrically, wherein said first and second electrode pad groups are spaced apart a predetermined distance so as to allow the unitary circuit board to be severed in a width direction thereof, thereby forming the first circuit board with the first electrode pad group disposed thereon and the second circuit board with the second electrode group disposed thereon, whereby the first and second circuit boards may be re-connected by another connection body which re-connects the first electrode pad group to the second electrode pad group.

2. The solid-state image pickup device according to claim 1, wherein a wiring member for electrically connecting the unitary circuit board to the image pickup element chip is integral with a wiring member of the unitary circuit board.

3. The solid-state image pickup device according to claim 1, wherein the unitary circuit board is made of an organic or inorganic material and is rigid or bendable.

4. The solid-state image pickup device according to claim 1, further comprising a high-frequency-stopping electronic part mounted on the unitary circuit board between the first electrode pad group and an internal electrode pad group that is electrically connected to the image pickup element chip.

5. The solid-state image pickup device of claim 1, wherein the unitary circuit board has opposing surfaces, each of said surfaces having one of the electronic parts mounted thereto.

6. The solid-state image pickup device of claim 1, wherein after the unitary circuit board is severed into the first and second circuit boards, the first circuit board remains electrically connected to the image pickup element chip and extends approximately perpendicularly to the back surface of the image pickup element chip, and the first and second circuit boards are movable relative to each other.

7. A solid-state image pickup device comprising:
a solid-state image pickup element chip; and
a plurality of unitary circuit boards mounted with electronic parts, electrically connected to the image pickup element chip, and extending approximately perpendicularly to a back surface of the image pickup element chip and approximately parallel with each other, each unitary circuit board being adapted to be severed into first and second circuit boards which may then be readily re-connected and comprising:
first and second electrode pad groups provided adjacent to the image pickup element chip and connected to each other electrically, wherein said first and second electrode pad groups are spaced apart a predetermined distance so as to allow the unitary circuit board to be severed in a width direction thereof, thereby forming the first circuit board with the first electrode pad group disposed thereon and the second circuit board with the second electrode group disposed thereon, whereby the first and second circuit boards may be re-connected by another connection body which re-connects the first electrode pad group to the second electrode pad group.

8. The solid-state image pickup device according to claim 7, wherein wiring members for electrically connecting the plurality of unitary circuit boards to the image pickup element chip are integral with wiring members of the unitary circuit boards, respectively.

9. The solid-state image pickup device according to claim 7, wherein each of the plurality of unitary circuit boards is made of an organic or inorganic material and is rigid or bendable.

10. The solid-state image pickup device according to claim 5, further comprising a high-frequency-stopping electronic part mounted on at least one of the plurality of unitary circuit boards between the first electrode pad group and an internal electrode pad group that is electrically connected to the image pickup element chip.

* * * * *